United States Patent [19]

Okatani et al.

[11] 4,196,395
[45] Apr. 1, 1980

[54] PRESET STATE INDICATING UNIT IN AN ELECTRONIC TUNING TYPE RECEIVER

[75] Inventors: Masanao Okatani; Hiroshi Onishi; Yoshiaki Ishibashi; Reisuke Sato; Hisashi Suganuma; Tomohisa Yokogawa; Yoshiharu Ueki; Haruo Kama; Tadashi Kosuga, all of Kawagoe; Tadashi Ogawa, Saitama, all of Japan

[73] Assignee: Pioneer Electronic Corporation, Tokyo, Japan

[21] Appl. No.: 921,155

[22] Filed: Jun. 30, 1978

[30] Foreign Application Priority Data

Jun. 30, 1977 [JP] Japan .................................. 52/78080
Jun. 30, 1977 [JP] Japan .................................. 52/103986

[51] Int. Cl.² ............................................. H04B 1/16
[52] U.S. Cl. ................................... 455/154; 455/175; 455/180
[58] Field of Search ............... 325/455, 457, 458, 459, 325/464, 465, 468; 358/191, 192

[56] References Cited

U.S. PATENT DOCUMENTS

| 3,961,261 | 6/1976 | Pflasterer | 325/459 |
| 3,968,440 | 7/1976 | Ehni, III | 325/464 |
| 4,023,107 | 5/1977 | Tanaka | 325/455 |
| 4,085,372 | 4/1978 | Mogi et al. | 325/464 |

*Primary Examiner*—Robert L. Griffin
*Assistant Examiner*—Jin F. Ng
*Attorney, Agent, or Firm*—Sughrue, Rothwell, Mion, Zinn and Macpeak

[57] ABSTRACT

A preset state indicating unit for use in an electronic tuning type receiver generates a visual indication when both a presetting switch and one of a plurality of channel selecting switches have been properly selected. The preset state indicating unit thus insures that tuning information pertaining to a selected station is actually stored in memory during the presetting operation done by the user.

4 Claims, 1 Drawing Figure

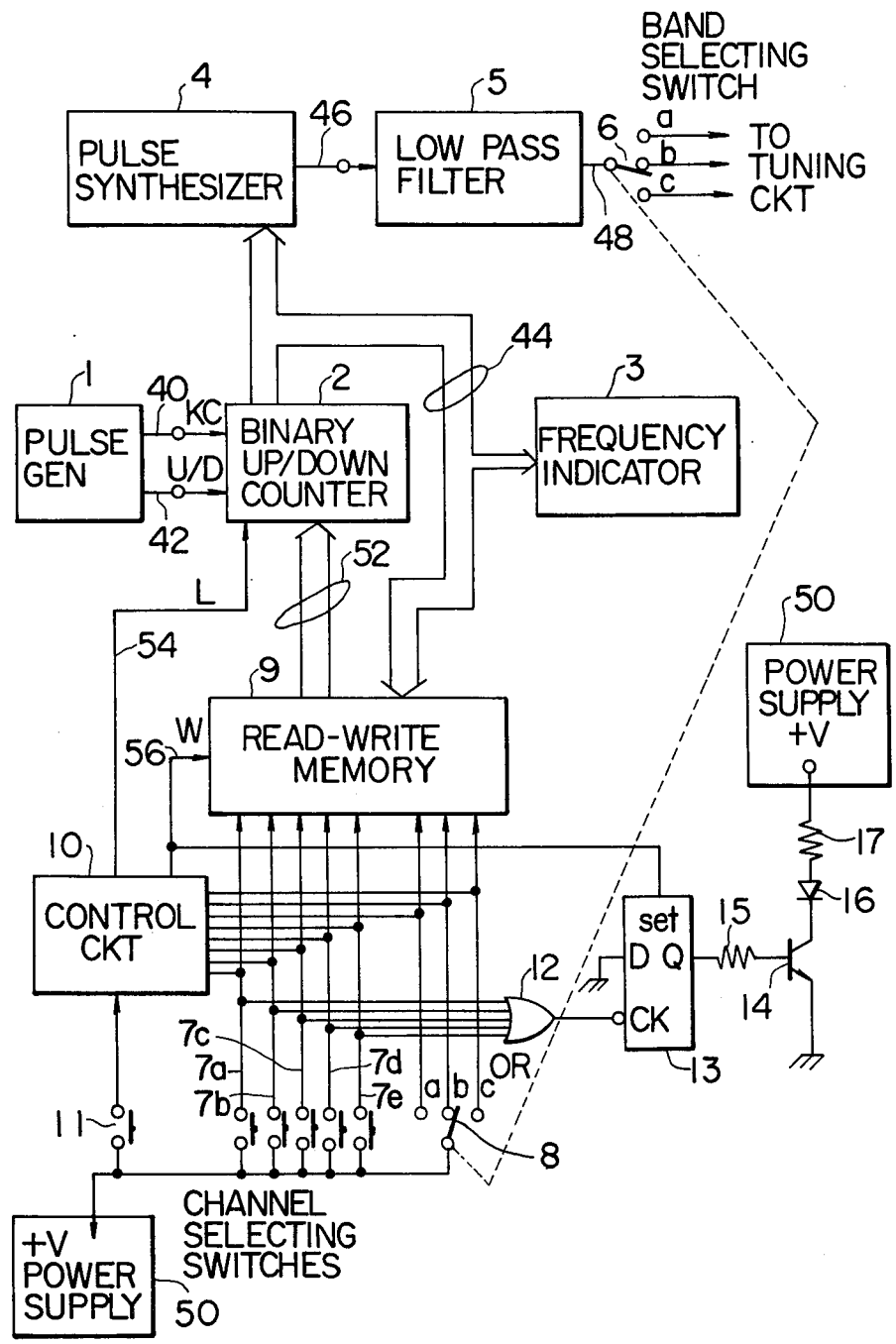

PRESET STATE INDICATING UNIT IN AN ELECTRONIC TUNING TYPE RECEIVER

BACKGROUND OF THE INVENTION

1. Field of the Invention

This invention relates to a preset state indicating unit in an electronic tuning type receiver, which indicates that a presetting operation has been positively carried out.

2. Description of the Prior Art

Recently, as a result of the rapid progress in electronic technology, a receiver capable of electronically performing preset station selection has been proposed. In this preset type receiver, a memory is addressed by the outputs from band selecting and channel selecting switches, and band and channel signals stored in the selected address of the memory are read out and provided to an up-down counter. In this connection it should be noted that the up-down counter also provides to the user the capability of manually tuning of the receiver.

Returning to the explanation of the preset mode of operation, the digital output of the up-down counter is converted into an analog signal and is applied to an electronically-controlled variable capacitance diode (varactor diode). The variable capacitance diode is part of the tuning circuit of the receiver. Thus, the digital information read out from the selected address of the memory controls via the up-down counter the signal selected by the tuning circuit of the preset type receiver.

The channel selecting switches mentioned above are, for example, non-lock type switches, while the band selecting switch is, for example, a rotary switch. Whenever these channel selecting switches and the band selecting switch provide channel and band selecting address signals to the memory, the band and channel signals stored in the selected address are outputted and provided to the up-down counter.

In the electronic tuning type receiver thus discussed, the tuning information for a desired station is stored for future retrieval when both the channel selecting switches and a presetting switch are selectively operated, e.g., closed, by the user. However, if these switches are not, for any reason, sufficiently depressed or properly selected by the user, the tuning information for a desired station is not stored in the memory, and thus, the presetting operation (storage operation) is not performed. However, in such prior art electronic tuning type receivers, the user is not provided with any information to indicate that the presetting operation has not been performed.

SUMMARY OF THE INVENTION

Accordingly, it is an object of the present invention to provide the capability which will eliminate the above-described difficulties.

Specifically, it is an object of the present invention to provide an indicating element, for example, a light emitting diode, which is lighted only when presetting (i.e., tuning information for a desired station) information is being stored in the memory.

The present invention is a preset state indicating unit for use in an electronic tuning type receiver which generates a visual indication when both a presetting switch and one of a plurality of channel selecting switches have been properly selected. The preset state indicating unit thus insures that tuning information pertaining to a selected station is actually stored in memory during the presetting operation done by the user.

BRIEF DESCRIPTION OF THE DRAWING

FIG. 1 shows in block diagram form one embodiment of the preset state indicating unit of the present invention for use in an electronic tuning type receiver.

DETAILED DESCRIPTION OF THE PREFERRED EMBODIMENT

Turning now to FIG. 1, the preset state indicating unit of the present invention for use in an electronic tuning type receiver includes the following. A pulse generator 1 selectively generates an up-pulse, designated by the reference letter U, or a down-pulse, designated by a reference letter D, together with a clock pulse, designated by the reference letters KC, when the user manually tunes the receiver to select a desired frequency or signal. The up-pulse/down-pulse information and the clock pulse information is provided via lines 40, 42, respectively, to a binary up/down counter 2. Counter 2 counts the clock pulse information from line 40 in either an up or a down direction in accordance with the information present on the up/down pulse line 42. The output count information from counter 2 is in a parallel format and is provided to a bus 44.

A frequency indicator stage 3 is adapted to receive from bus 44 the several higher significant bits of the count output from counter 2. Frequency indicator stage 3 provides a digital visual display of the frequency being selected by the tuning circuit (not shown).

A pulse synthesizer 4 is adapted to receive from bus 44 the count output from counter 2. An oscillation signal generated by pulse synthesizer 4 is frequency-divided in accordance with the count output from counter 2 so that a serial pulse train having a pulse number which corresponds to the output of the counter 2 is provided at an output line 46 of pulse synthesizer 4. The serial pulse train on line 46 is provided to the input of a low-pass filter 5, which removes the high frequency components and provides on an output line 46 a DC voltage signal whose amplitude corresponds to the count output from counter 2. In other words, low-pass filter 5 acts as a digital-to-analog converter of the serial pulse train on line 46. The DC voltage signal on line 48 is selectively applied via a band selecting switch 6, discussed in detail below, to the electronically-controlled variable capacitance diode (varactor diode) in the tuning circuit (not shown). Thus, the DC voltage signal on line 48 electronically controls the tuning of the receiver.

The band selecting switch 6 allows the user to manually selected the desired band of frequencies for which the receiver is tuned. As shown in FIG. 1, switch 6 has three stationary contacts a, b, c for selecting bands A, B or C, respectively. Of course, switch 6 can have any desired number of stationary contacts. Switch 6 is associated in ganged fashion with a band selecting switch 8 which also has three stationary contacts a, b, c for selecting bands A, B, or C, respectively. As is the case of switch 6, switch 8 can also have any desired number of stationary contacts.

Separate channel selecting switches 7a to 7e of the non-lock or push button type are also provided. Channel selecting switches 7a to 7e together with the band selecting switch 8 provided control voltages from power supply 50 to a read-write memory 9. These control voltages are the address signals for memory 9. As discussed below, read-write memory 9 on command operates to store the output of the up-down counter 2 on bus 44 in address specified by the outputs of the channel selecting switches 7a through 7e and the band selecting switch 8, or to read and supply the tuning information stored in the specified address to the up-down counter 2 via bus 52.

A control circuit 10 is also provided and is adapted to receive the address control voltages from the channel selecting switches 7a to 7e and the band selecting switch 8. A presetting switch 11 of the non-lock or push button type also provides a control voltage from power supply 50 to the control circuit 10. When the presetting switch 11 is OFF, control circuit 10 provides a load signal L on a line 54 to the up-down counter 2 when the channel selecting switches 7a through 7e provide their outputs. On the other hand, when the presetting switch 11 is ON, control circuit 10 provides a write pulse W on a line 56 to the read-write memory 9 when the channel selecting switches 7a through 7e provide their outputs. It should be noted that when none of the selecting switches 7a through 7e have been selected by the user, control circuit 10 does not provide either a load signal L to line 54 or a write pulse W to line 56.

As shown in FIG. 1, reference numeral 12 designates an OR circuit adapted to deliver the OR output of the channel selecting switches 7a through 7e to the input clock terminal CK of a D-type flip-flop, designated by reference numeral 13. Flip-flop 13 has the input terminal D grounded, and has the write pulse W on line 56 applied to its setting input. A transistor 14 is connected through a resistor 15 to the set output terminal Q of flip-flop 13. Transistor 15 is of the NPN type because power supply 50 provides a positive voltage. Reference numeral 16 designates a visual indicator device, such as a light emitting diode, which is connected between power source 50 and ground through switching transistor 14 and a current-emittings resistor 17. Transistor 14 is driven to the conductive or ON state only when the signal at output terminal Q of flip-flop 13 is in the high or 1 state. Diode 16 is lighted only when transistor 14 is ON.

The user manually operates or tunes the receiver by operating, i.e., tuning, pulse generator 1, which provides clock pulses KC and up/down U/D pulses to counter 2, as described above. Counter 2, in turn, provides an output count signal in parallel format via bus 44 to pulse synthesizer 4. Pulse synthesizer 4, in turn, provides a serial pulse train via line 46 to the input of low-pass filter 5, whose output is a DC voltage signal whose amplitude corresponds to the count output from counter 2. The DC voltage signal is applied via band selecting switch 6 to the tuning circuit and electronically controls the tuning of the receiver. The user can manually tune the receiver in the above-described manner only when none of the selecting switches 7a through 7e have been selected.

The method to preset the receiver to a desired station is now described. After the user has manually selected the desired station in accordance with the above-described method, the presetting switch 11 is first turned, and then the channel selecting switches 7a through 7e corresponding to the address of the channel to the preset is turned. As a result, the write pulse W is applied to the read-write memory 9 by the control circuit 10, which causes the count output of the up-down counter 2 (i.e., the digital signal representative of the tuning frequency being received) to be stored in memory 9 in the address specified by the band selecting switch 8 and by the channel selecting switches 7a through 7e which have been turned as described above. Desired frequencies can be preset for other channels in a similar fashion.

In the case where none of the channel selecting switches 7a through 7e have been turned ON, the D-type flip-flop 13 receives at its clock input CK the output of OR gate 12, which is at the low or OFF level. Flip-flop 13 stores the state of the input signal applied to terminal D at the time of the trailing edge of the clock pulse input CK. Because the output of OR gate 12 is low, the set output Q of the flip-flop 13 is at the OFF or 0 level, which puts transistor 14 into the OFF state. Because transistor 14 is OFF, light emitting diode 16 is not lighted.

When, however, the presetting switch 11 and one of the channel selecting switches 7a through 7e are positively closed, control circuit 10 supplies the write pulse W to the read-write memory 9, which causes the count output of the up-down counter 2 to be stored therein at the designated address. In addition, the write pulse W is also applied to the set input terminal of flip-flop 13, as a result of which the set output Q of the flip-flop 13 is raised to the high or 1 level independently of the state of the clock pulse CK. Accordingly, the transistor 14 is turned ON, which causes light emitting diode 16 to be lighted, indicating that the presetting operation has been positively carried out. When the channel selecting switches 7a through 7e are released, the level of the clock pulse CK supplied through the OR gate 12 goes from the high to the low level. When this change in state occurs, flip-flop 13 is reset, which causes the light emitting diodes 16 to no longer be lighted.

In the case where the operation of the presetting switch 11 or the channel selecting switches 7a through 7e are incomplete, no write pulse W is outputted by the control circuit 10, and therefore, flip-flop 13 is not set. Accordingly, the light emitting diode 16 is not lighted.

The method for automatically tuning the receiver to a frequency stored in memory 9 is now described. The address where a digital signal corresponding to a desired station is selected by the band selecting switch 8 and one of the channel selecting switches 7a through 7e. In this operation, because the presetting switch 11 is open or in the OFF state, the control circuit 10 applies the load signal L to the up-down counter 2. As a result, the read-write memory 9 reads out the information stored at the address indicated by the band selecting switch 8 and the channel selecting switches 7a through 7e. The signal read out from read-write memory 9 is applied in a parallel format via bus 52 to up-down counter 2, the output of which is applied to the digital synthesizer 4. This results in a station being selected in a manner similarly to the case of manual operation. Thereafter, preset station selection in the same band can be accomplished by selectively turning only the channel selecting switches 7a through 7e. In addition, preset station selections in different bands can be accomplished by selectively operating the channel selecting switches 7a through 7e after the band selecting switch 8 has been changed.

In the method for automatically tuning the receiver, light emitting diode 16 is never lighted because the presetting switch 11 is in the OFF state. Because switch 11 is in the OFF state, no write pulse W is outputted by control circuit 10 and flip-flop 13 is therefore not set.

As is apparent from the above description, the preset state indicating unit of the present invention only provides a visual indication when the presetting operation has been positively carried out. Accordingly, the present invention indicates to the user when presetting errors due to incomplete switching operation have occurred, and it thus ensures that the desired tuning information has been stored in memory 9.

What is claimed is:

1. In an electronic tuning type receiver of the type having a pulse generator, a binary up/down counter means normally responsive to the output of said pulse generator but responsive upon receipt of a load signal from control circuit means to tuning information from a read-write memory for providing output count information, said control circuit means being responsive to the output from a presetting switch and responsive to the outputs from a band selecting switch and a plurality of channel selecting switches for providing said load signal when there are outputs only from said band selecting switch and said plurality of channel selecting switches and for providing a write pulse to said read-write memory when there are outputs from said presetting switch and from said band selecting switch and said plurality of channel selecting switches, said read-write memory responsive to said output count information for storing said information upon receipt of said write pulse at an address designated by the outputs of both said band selecting switch and of said plurality of channel selecting switches, the improvement comprising:

a. coincidence means responsive to said outputs of said plurality of channel selecting switches for providing a first output signal when an output is present from at least one of said channel selecting switches;
   b. one-shot means responsive to said write pulse and to said first output signal for providing a second output signal when both said write pulse and said first output signal are present; and
   c. indicator means responsive to said second output signal for providing a visual indication.

2. The apparatus as recited in claim 1, wherein said one-shot means is a D-type flip-flop having a CK input responsive to said first output signal, having a D input which is grounded, having a set input responsive to said write pulse, and having a Q output as said second output signal.

3. The apparatus as recited in claim 1, wherein said coincidence is an OR gate.

4. The apparatus as recited in claim 1, wherein said indicator means includes a transistor having an emitter which is grounded, having a base which is responsive via a first resistor to said second output signal, and having a collector which is connected via a light emitting diode and a second resistor in series connection to a voltage supply.

* * * * *